United States Patent
Chen et al.

(10) Patent No.: US 8,325,482 B2
(45) Date of Patent: Dec. 4, 2012

(54) COOLING APPARATUS FOR SERVER RACK

(75) Inventors: Chao-Jung Chen, Taipei (TW);
Kai-Hung Lin, Chung Ho (TW);
Chih-Ming Chen, Banqiao (TW);
Wen-Liang Huang, Taoyuan Shien (TW)

(73) Assignee: Quanta Computer Inc., Taoyuan Shien (TW)

( * ) Notice: Subject to any disclaimer, the term of this patent is extended or adjusted under 35 U.S.C. 154(b) by 180 days.

(21) Appl. No.: 12/926,819

(22) Filed: Dec. 10, 2010

(65) Prior Publication Data

US 2012/0018139 A1    Jan. 26, 2012

(30) Foreign Application Priority Data

Jul. 21, 2010 (TW) .............................. 99124018 A

(51) Int. Cl.
*H05K 7/20* (2006.01)
*F28F 27/00* (2006.01)

(52) U.S. Cl. ......... 361/696; 165/121; 361/695; 361/699

(58) Field of Classification Search ................. None
See application file for complete search history.

(56) References Cited

U.S. PATENT DOCUMENTS

| | | | |
|---|---|---|---|
| 6,374,327 B2* | 4/2002 | Sakaki et al. | 711/112 |
| 6,886,353 B2* | 5/2005 | Patel et al. | 62/180 |
| 7,957,142 B2* | 6/2011 | Noteboom et al. | 361/696 |
| 8,174,829 B1* | 5/2012 | Rotheroe | 361/696 |
| 2008/0158815 A1* | 7/2008 | Campbell et al. | 361/696 |
| 2009/0173473 A1* | 7/2009 | Day | 165/67 |
| 2011/0105010 A1* | 5/2011 | Day | 454/184 |
| 2012/0026676 A1* | 2/2012 | Chang | 361/679.47 |

* cited by examiner

*Primary Examiner* — Gregory Thompson
(74) *Attorney, Agent, or Firm* — Rabin & Berdo, P.C.

(57) ABSTRACT

A cooling apparatus for server rack is disclosed, which is disposed above at least one server rack. The cooling apparatus for server rack includes a fan module disposed at a back end above the least one server rack, a heat exchanger module disposed at a front end above the least one server rack, and an air guide connecting the fan module and the heat exchanger module. A hot air exhausted from the back end of the least one server rack is extracted by the fan module and is sent to the heat exchanger module through the air guide, and the hot air is cooled by the heat exchanger module, and a cool air is exhausted from the front end of the least one server rack.

14 Claims, 5 Drawing Sheets

COOLING APPARATUS FOR SERVER RACK

RELATED APPLICATIONS

This application claims priority to Taiwan Application Serial Number 99124018, filed Jul. 21, 2010, which is herein incorporated by reference.

BACKGROUND

1. Field of Invention

The present invention relates to a cooling apparatus. More particularly, the present invention relates to a cooling apparatus for server rack.

2. Description of Related Art

With the rapid development of various technologies and the pervasiveness of computer dependency in enterprise, the market demand for server systems is rising. Due to the growth in business, larger companies usually use tens of or hundreds of low-cost servers or blade servers in order to deal with a great number of data or Internet traffic. The so-called "Blade Server" refers to an entire server designed to fit on a small plug-and-play card or board (CPUs, RAM or hard drives are usually included thereon). Several blade servers can be installed in one rack, sharing the same power supplies, monitor, keyboard and other electronic components while offering potentially easier maintenance. Several blade servers can be further set in a server rack, integrating all blade servers while enabling users to efficiently and rapidly access them.

With the rapid development of the cloud technology, the loading and the efficiency requirement of the servers are highly increased, and the heat generated by the server rack is also increased. Only depending on the fans within the servers is not sufficient to cool the server rack, and the efficiency of servers is limited.

For the forgoing reasons, there is a need to improve the cooling efficiency of server rack.

SUMMARY

An object of the invention is to provide a cooling apparatus for server rack to improve the cooling efficiency of the server rack.

An aspect of the invention provides a cooling apparatus for server rack disposed above at least one server rack. The cooling apparatus for server rack includes a fan module disposed at a back end above the least one server rack, a heat exchanger module disposed at a front end above the least one server rack, and an air guide connecting the fan module and the heat exchanger module. A hot air exhausted from the back end of the least one server rack is extracted by the fan module and is sent to the heat exchanger module through the air guide, and the hot air is cooled by the heat exchanger module, and a cool air is exhausted from the front end of the least one server rack.

The heat exchanger module includes plural heat exchangers, and a pipe for parallel connecting the heat exchangers. The pipe includes an inlet, an outlet, and plural valves disposed at the inlet and the outlet. The cooling apparatus for server rack further includes a water collector disposed under the heat exchanger module. The cooling apparatus for server rack further includes a hub control unit connecting to the fan module and the heat exchanger module. The cooling apparatus for server rack further includes a cloud operating system for controlling the fan module, the heat exchanger module, and plural servers in the least one server rack via the hub control unit. The cooling apparatus for server rack further includes a center message manage service. The cloud operating system manages the servers, the fan module, and the heat exchanger module via the center message manage service.

Another aspect of the invention is a cooling apparatus for server rack disposed under at least one server rack. The cooling apparatus for server rack includes a fan module disposed at a back end under the least one server rack; a heat exchanger module disposed at a front end under the least one server rack; and an air guide connecting the fan module and the heat exchanger module. A hot air exhausted from the back end of the least one server rack is extracted by the fan module and is sent to the heat exchanger module through the air guide, and the hot air is cooled by the heat exchanger module, and a cool air is exhausted from the front end of the least one server rack.

The heat exchanger module includes plural heat exchangers, and a pipe for parallel connecting the heat exchangers. The pipe includes an inlet, an outlet, and plural valves disposed at the inlet and the outlet. The cooling apparatus for server rack further includes a water collector disposed under the heat exchanger module. The cooling apparatus for server rack further includes a hub control unit connecting to the fan module and the heat exchanger module. The cooling apparatus for server rack further includes a cloud operating system for controlling the fan module, the heat exchanger module, and plural servers in the least one server rack via the hub control unit. The cooling apparatus for server rack further includes a center message manage service. The cloud operating system manages the servers, the fan module, and the heat exchanger module via the center message manage service.

According to above aspects, the present invention has the following advantages.

1. The cooling apparatus for server rack can be used to cool at least one server rack. The cooling apparatus for the server rack is disposed above or under the server rack, therefore the front door or back door of the server rack can move smoothly.

2. The heat exchangers of the heat exchanger module are parallel connected by the pipe. Thus the number of the heat exchangers of the heat exchanger module can be adjusted according to the number of the servers in the server rack easily.

3. The heat exchanger module can provide dehumidify function by reducing the temperature of fluid entering the heat exchanger module. The moisture in the air is congealed to water drop gathered on the water collector.

4. The control circuit can control the fan speed of the fan module and the volume of the fluid for the heat exchanger module according to the temperature and the power consumption of the server rack for saving energy.

5. The present invention can be utilized in the cloud operating system. The cloud operating system can monitor the operation status of each server in the server rack. The cloud operating system can send message to the center message manage service to manage the servers in the server rack and the related cooling apparatus.

It is to be understood that both the foregoing general description and the following detailed description are by examples, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE EMBODIMENTS

Figure 1:
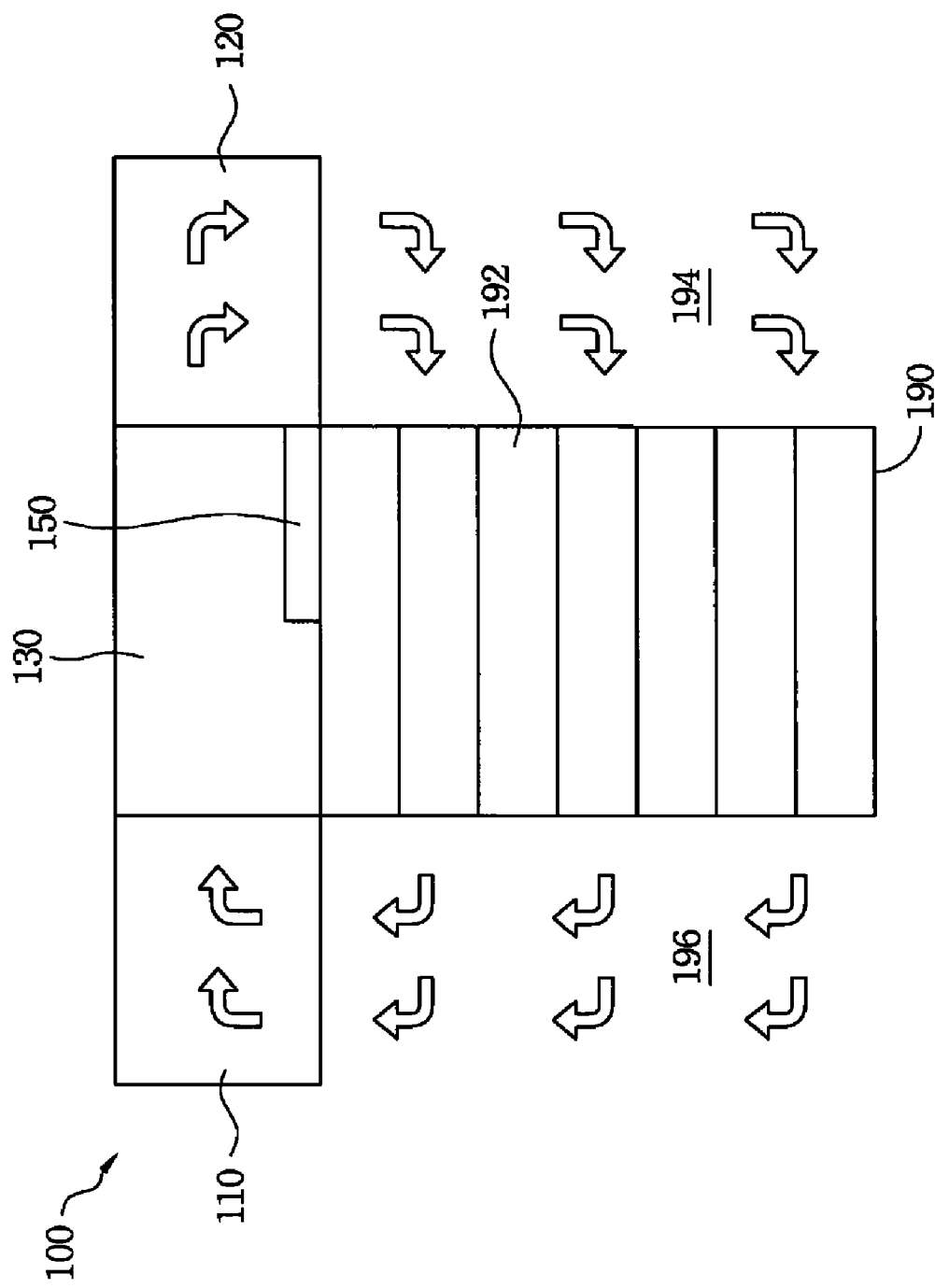
FIG. 1 is a schematic diagram of a first embodiment of the cooling apparatus for server rack of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic diagram of a first embodiment of the cooling apparatus for server rack of the invention. The cooling apparatus for server rack 100 is disposed above at least one server rack 190. A plurality of servers 192 are disposed in the server rack 190. The cooling apparatus for server rack 100 is utilized for cooling the server rack 190 and the servers 192 within. The server rack 190 includes a front end 194 and a back end 196. The front end 194 of the server rack 190 refers to the end having the operating panel and displaying the status of the servers 192. The back end 196 of the server rack 190 refers to the end where the connecting wires connect. The cooling apparatus for server rack 100 is disposed above the server rack 190. Therefore the front door or the back door of the server rack 190 would open smoothly while the servers 192 in the server rack 190 is replaced.

The cooling apparatus 100 includes a fan module 110, a heat exchanger module 120, and an air guide 130 for connecting the fan module 110 and the heat exchanger module 120. The cooling apparatus for server rack 100 is disposed above the server rack 190. The fan module 110 is disposed at the back end 196 above the server rack 190. The heat exchanger module 120 is disposed at the front end 194 above the server rack 190. The fan module 110 and the heat exchanger module 120 are disposed at opposite sides of the server rack 190 and protrude from the server rack 190.

The fan of the fan module 110 can be pulse width modulation (PWM) fan for real time adjusting the fan speed according the temperature. The cooling apparatus for server rack 100 includes a control circuit 150 disposed on the server rack 190 and connects to the fan module 110 and the heat exchanger module 120. The control circuit 150 controls the cooling efficiency of the fan module 110 and the heat exchanger module 120 according to the temperature of the server rack 190.

A huge heat would be generated while the servers 192 operate. The heat would be transferred to a hot air exhausted from the back end 196 of the server rack 190. The fan module 110 extracts the hot air and sends the hot air to the heat exchanger module 120 through the air guide 130. The hot air would be cooled by the heat exchanger module 120 and become cool air. The cool air is further exhausted from the front end 194 of the server rack 190.

The fan module 110 extracts the hot air would form a negative pressure at the back end 196 of the server rack 190. Furthermore, the hot air would tend to rise, and the cool air would tend to sink. Therefore the cool air cooled by the heat exchanger module 120 would sink from the front end 194 of the server rack 190 and the pass through the server rack 190 for cooling the server rack 190. The cool air would be lead to the back end 196 of the server rack 190 and take away the heat generated by the servers 192 due to the pressure differential between the front end 194 and the back end 196, wherein the pressure differential is generated by the fan module 110 extracting the air and the fan direction of the fan module 110. The hot air exhausted from the back end 196 of the server rack 190 would enter to the cooling apparatus for server rack 100 again. Thus the server rack 190 and the servers 192 within can be cooled circularly.

Figure 2:
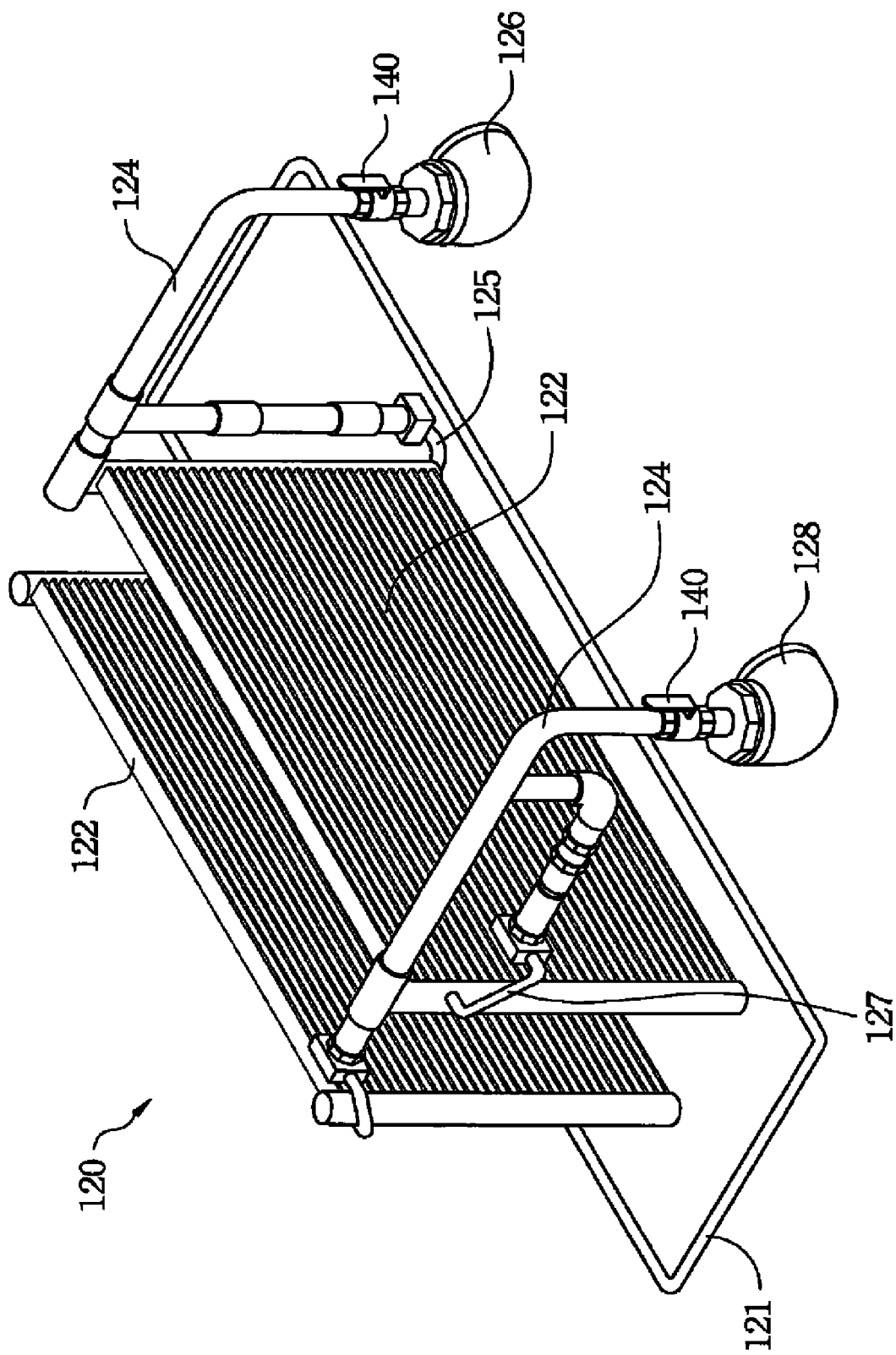
FIG. 2 is an oblique diagram of the heat exchanger module in FIG. 1.

FIG. 2 is an oblique diagram of the heat exchanger module in FIG. 1. The heat exchanger module 120 includes plural heat exchangers 122 and a pipe 124 for connecting the heat exchangers 122. The heat exchangers 122 are parallel connected. The pipe 124 has an inlet 126 and an outlet 128. The water, the refrigerant, or other fluid for heat exchanging can enter the heat exchangers via the inlet 126. The heat exchangers 122 heat exchanges to the hot air for cooling the hot air, and the fluid can leave the heat exchangers 122 via the outlet 128.

The pipe 124 further includes plural branch inlets 125 branched from the inlet 126, and plural branch outlets 127 branched from the outlet 128. The branch inlets 125 and the branch outlets 127 couple to the heat exchangers 122, and the heat exchangers 122 are parallel connected by the pipe 124. The fluid for the heat exchanger module 120 may enter the inlet 126 and distribute to the branch inlets 125 to heat exchange to the heat exchangers 122 respectively. The fluid from the branch outlets 127 would be gathered at the outlet 128 and leave the heat exchanger module 120.

The heat exchanger module 120 further includes plural valves 140. The valves 140 are disposed at the inlet 126 and the outlet 128 to control the volume of the fluid entering or leaving the heat exchanger module 120. The heat exchanger module 20 further includes a water collector 121 for dehumidifying. The temperature of the fluid entering the heat exchanger module 120 can be reduced when the heat exchanger module 120 is dehumidifying. The temperature of the fluid is preferably lower than the room temperature. The moisture in the air would touch the pipe 124 with lower temperature and congeal into water drops. The water drops would fall to the water collector 121, and the moisture in the server rack can be dehumidified.

Figure 3:
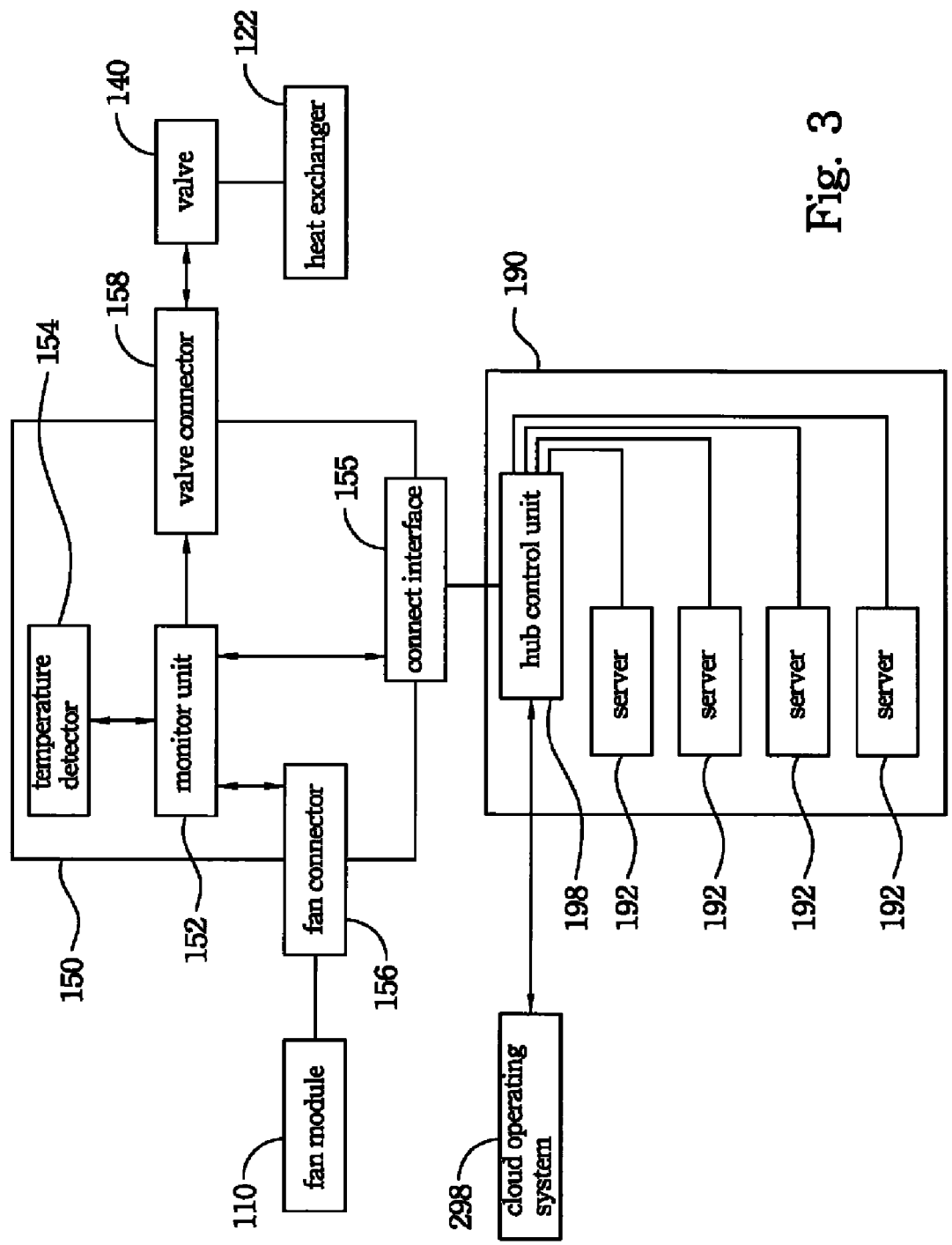
FIG. 3 is a block diagram of an embodiment of the cooling apparatus for server rack of the invention.

FIG. 3 is a block diagram of an embodiment of the cooling apparatus for server rack of the invention. The present invention can be utilized in the cloud operating system 298. The control circuit 150 is disposed on the server rack 190. A hub control unit 198 is connected to the servers 192 respectively. The control circuit 150 includes a monitor unit 152, a temperature detector 154, a fan connector, a valve connector 158, and a connect interface 155 to connect to the servers 192 disposed in the server rack 190. The temperature detector 154, the fan connector 156, the valve connector, and the connect interface 155 are connected to the monitor unit 152 respectively, and the cloud operating system 298 can receive the signal from the monitor unit 152 or send the signal to the monitor unit 152 via the connect interface 155 and the hub control unit 198.

The temperature detector 154 detects the temperature of the server rack 190. More particularly, the temperature detector 154 detects the temperatures of the front end and the back end of the server rack 190. The temperatures detected by the temperature detector 154 is sent to the monitor unit 152, and the signals of the temperatures further send to the cloud operating system 298 via the connect interface 155 and the hub control unit 198. The fan module 110 can read the temperatures of front end and the back ends of the server rack 190 provided by temperature detector 154 in the monitor unit 152 via the fan connector 156. The fan speed of the fan module 110 can be adjusted by the monitor unit 152 according to the temperatures of the front end and the back end of the server rack 190.

The monitor unit 152 can also adjust the volume of the fluid entering the heat exchanger 122 according to the temperatures of the front end and the back end of the server rack 190 provided by the temperature detector 154. The valve 140 can be solenoid valve. The volume signal provided by the monitor unit 152 is sent to the valve 140 via the valve connector 158, and the valve 140 can change the volume of the fluid entering the heat exchanger 122.

The hub control unit 198 is disposed in the server rack 190. The hub control unit 198 connects to the servers 192 and the connect interface 155 respectively. Each of the servers 192 is managed by the cloud operating system 298. Each of the servers 192 can be turned on or shut down by the cloud operating system 298 via the hub control unit 198. The operation statuses of the servers 192 are sent to the cloud operating system 298 via the is hub control unit 198. The operation status of the servers 192 provided by the cloud operating system 298 can be further sent to the monitor unit 152 via the hub control unit 198 and the connect interface 155. The operating number and the power consumption of the servers 192 and the loading thereof would decide the heat generated from the servers 192. The monitor unit 152 can control the fan speed of the fan module 110 and the volume of the valve 140 according to the signal provided by the cloud operating system 298 via the hub control unit 198.

Figure 4:
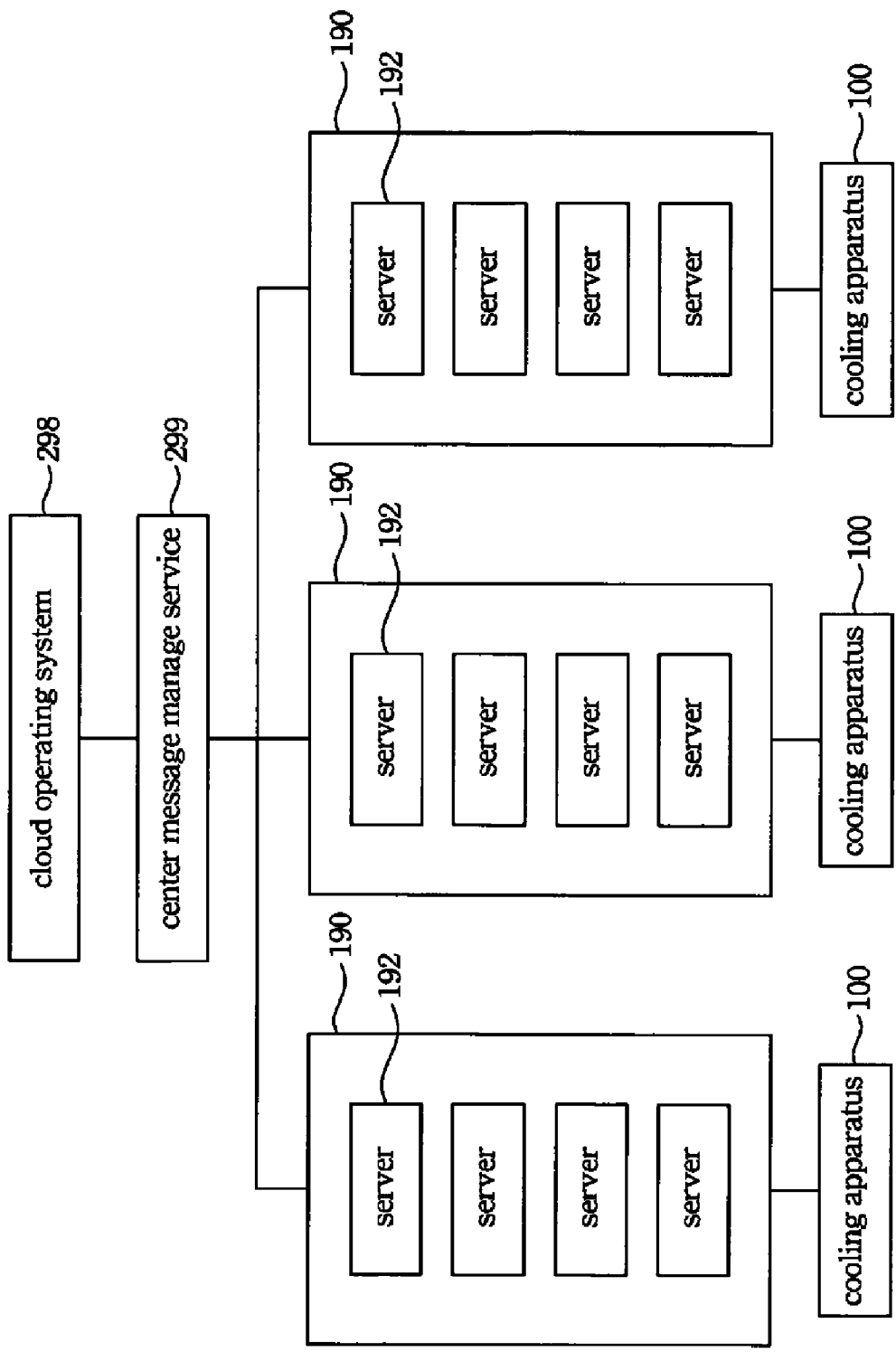
FIG. 4 is a block diagram of an embodiment of the cooling apparatus for server rack of the invention.

FIG. 4 is a block diagram of an embodiment of the cooling apparatus for server rack of the invention. The cloud operating system 298 can monitor and manage the operation of plural server racks 190 simultaneously. The cloud operating system 298 can manage the servers 192 in the server rack 190 and the cooling apparatus 100 thereof with a center message manage service 299.

Figure 5:
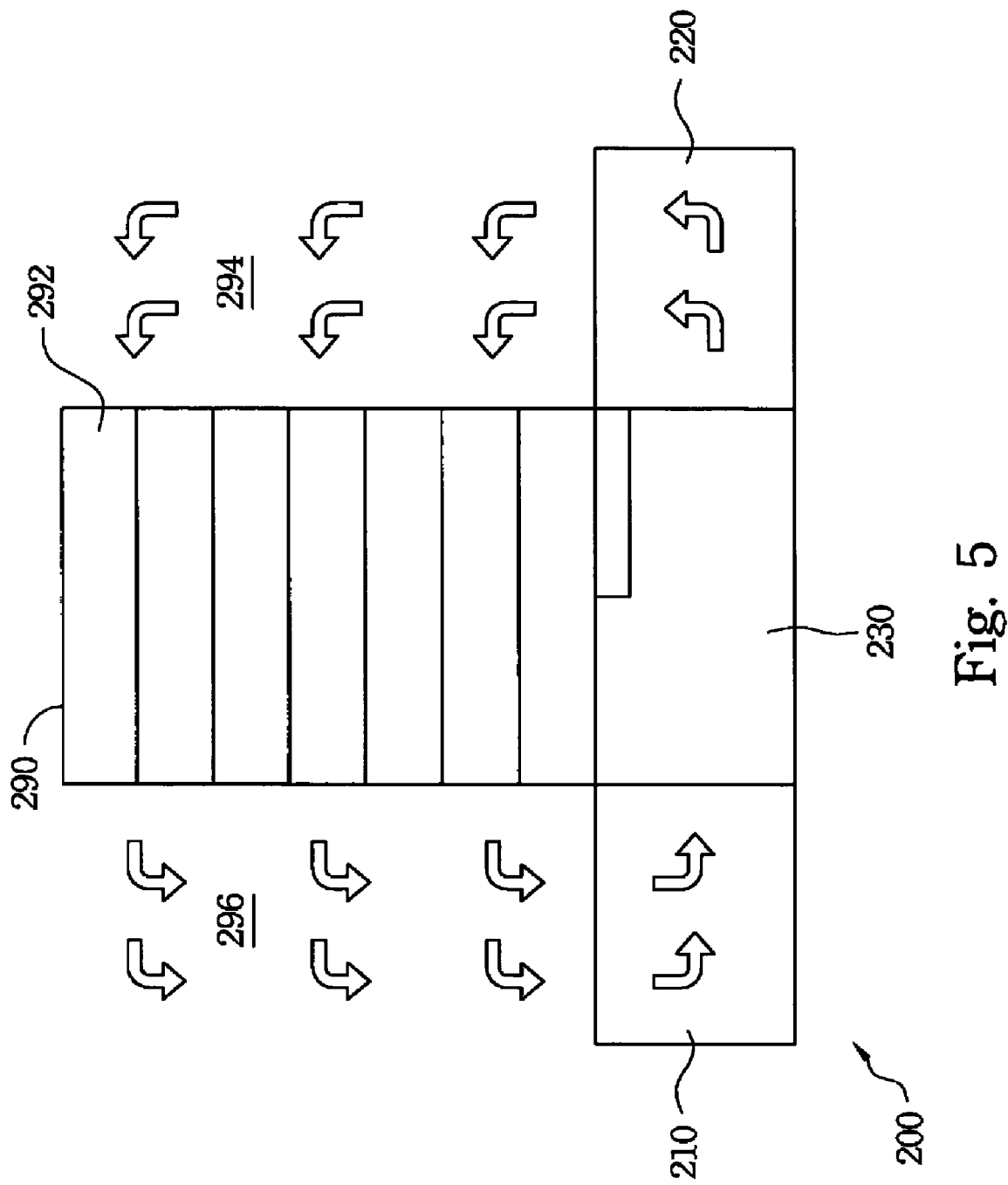
FIG. 5 is a schematic diagram of a second embodiment of the cooling apparatus for server rack of the invention.

FIG. 5 is a schematic diagram of a second embodiment of the cooling apparatus for server rack of the invention. The cooling apparatus for server rack 200 is disposed under at least one server rack 290. The servers 292 are disposed in the server rack 290. The cooling apparatus for server rack 200 is utilized for cooling the server rack 290 and the servers 292 within. The cooling apparatus 200 includes the fan module 210, the heat exchanger module 220, and the air guide 230 for connecting the fan module 210 and the heat exchanger module 220. The cooling apparatus for server rack 200 is disposed under the server rack 190. The fan module 210 is disposed at the back end 296 under the server rack 290. The heat exchanger module 220 is disposed at the front end 294 under the server rack 290. The fan module 210 and the heat exchanger module 220 are disposed at opposite sides of the server rack 290 and protrude from the server rack 290. Therefore the front door or the back door of the server rack 290 would open smoothly while the servers 292 in the server rack 290 is replaced.

The hot air exhausted from the back end of the servers 292 in the server rack 290 is extracted by the fan module 210. The hot air is sent to the heat exchanger module 220 thorough the air guide 230 for being cooled. The cool air is sent from the front end 294 of the server rack 290. The air can cool the server rack 290 circularly due to the negative pressure generated by the extraction of the fan module 210.

According to above embodiments, the present invention has the following advantages.

1. The cooling apparatus for server rack can be used to cool at least one of server rack. The cooling apparatus for the server rack is disposed above or under the server rack, therefore the front door or back door of the server rack can move smoothly.

2. The heat exchangers of the heat exchanger module are parallel connected by the pipe. Thus the number of the heat exchangers of the heat exchanger module can be adjusted according to the number of the servers in the server rack easily.

3. The heat exchanger module can provide dehumidify function by reducing the temperature of fluid entering the heat exchanger module. The moisture in the air is congealed to water drop gathered on the water collector.

4. The control circuit can control the fan speed of the fan module and the volume of the fluid for the heat exchanger module according to the temperature and the power consumption of the server rack for saving energy.

5. The present invention can be utilized in the cloud operating system. The cloud operating system can monitor the operation status of each server in the server rack. The cloud operating system can send message to the center message manage service to manage the servers in the server rack and the related cooling apparatus.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A cooling apparatus for server rack disposed above at least one server rack, the cooling apparatus for server rack comprising:
   a fan module disposed at a back end above the least one server rack;
   a heat exchanger module disposed at a front end above the least one server rack; and
   an air guide connecting the fan module and the heat exchanger module, wherein a hot air exhausted from the back end of the least one server rack is extracted by the fan module and is sent to the heat exchanger module through the air guide, and the hot air is cooled by the heat exchanger module, and a cool air is exhausted from the front end of the least one server rack.

2. The cooling apparatus for server rack of claim 1, wherein the heat exchanger module comprises a plurality of heat exchangers, and a pipe for parallel connecting the heat exchangers.

3. The cooling apparatus for server rack of claim 2, wherein the pipe comprises an inlet, an outlet, and a plurality of valves disposed at the inlet and the outlet.

4. The cooling apparatus for server rack of claim 1, further comprising a water collector disposed under the heat exchanger module.

5. The cooling apparatus for server rack of claim 1, further comprising a hub control unit connecting to the fan module and the heat exchanger module.

6. The cooling apparatus for server rack of claim 5, further comprising a cloud operating system for controlling the fan module, the heat exchanger module, and a plurality of servers in the least one server rack via the hub control unit.

7. The cooling apparatus for server rack of claim 6, further comprising a center message manage service, wherein the cloud operating system manages the servers, the fan module, and the heat exchanger module via the center message manage service.

8. A cooling apparatus for server rack disposed under at least one server rack, the cooling apparatus for server rack comprising:
   a fan module disposed at a back end under the least one server rack;
   a heat exchanger module disposed at a front end under the least one server rack; and
   an air guide connecting the fan module and the heat exchanger module, wherein a hot air exhausted from the back end of the least one server rack is extracted by the fan module and is sent to the heat exchanger module through the air guide, and the hot air is cooled by the heat exchanger module, and a cool air is exhausted from the front end of the least one server rack.

9. The cooling apparatus for server rack of claim 8, wherein the heat exchanger module comprises a plurality of heat exchangers, and a pipe for parallel connecting the heat exchangers.

10. The cooling apparatus for server rack of claim 9, wherein the pipe comprises an inlet, an outlet, and a plurality of valves disposed at the inlet and the outlet.

11. The cooling apparatus for server rack of claim 8, further comprising a water collector disposed under the heat exchanger module.

12. The cooling apparatus for server rack of claim 8, further comprising a hub control unit connecting to the fan module and the heat exchanger module.

13. The cooling apparatus for server rack of claim 12, further comprising a cloud operating system for controlling the fan module, the heat exchanger module, and a plurality of servers in the least one server rack via the hub control unit.

14. The cooling apparatus for server rack of claim 13, further comprising a center message manage service, wherein the cloud operating system manages the servers, the fan module, and the heat exchanger module via the center message manage service.

* * * * *